(12) United States Patent
Kobayashi (10) Patent No.: US 7,611,968 B2
(45) Date of Patent: Nov. 3, 2009

(54) WAFER LASER PROCESSING METHOD AND LASER BEAM PROCESSING MACHINE

(75) Inventor: Satoshi Kobayashi, Tokyo (JP)

(73) Assignee: Disco Corporation, Tokyo (JP)

( * ) Notice: Subject to any disclaimer, the term of this patent is extended or adjusted under 35 U.S.C. 154(b) by 109 days.

(21) Appl. No.: 11/984,532

(22) Filed: Nov. 19, 2007

(65) Prior Publication Data

US 2008/0124898 A1 May 29, 2008

(30) Foreign Application Priority Data

Nov. 24, 2006 (JP) .............................. 2006-317682

(51) Int. Cl.
*H01L 21/00* (2006.01)

(52) U.S. Cl. ............... 438/463; 438/460; 257/E21.516; 257/E21.347

(58) Field of Classification Search ................ 438/463, 438/460; 257/E21.516, E21.347
See application file for complete search history.

(56) References Cited

U.S. PATENT DOCUMENTS

2007/0253453 A1* 11/2007 Essaian et al. ................ 372/22

FOREIGN PATENT DOCUMENTS

JP 3408805 3/2003

* cited by examiner

*Primary Examiner*—Alexander G Ghyka
*Assistant Examiner*—Seahvosh J Nikmanesh
(74) *Attorney, Agent, or Firm*—Smith, Gambrell & Russell, LLP (57) ABSTRACT

A wafer laser processing method for forming deteriorated layers in the inside of a wafer having devices which are formed in a plurality of areas sectioned by a plurality of streets formed in a lattice pattern on the front surface along the streets by applying a laser beam along the streets, comprising: a first deteriorated layer forming step for forming a first deteriorated layer along the streets near the front surface of the wafer by applying a laser beam having a wavelength of 1,064 nm from the rear surface side of the wafer along the streets with its focal spot set to a position near the front surface of the wafer; and a second deteriorated layer forming step for forming a second deteriorated layer along the streets at a position closer to the rear surface of the wafer than the first deteriorated layer by applying a laser beam having a wavelength of 1,342 nm from the rear surface side of the wafer along the streets with its focal spot set to a position closer to the rear surface than the first deteriorated layer.

2 Claims, 7 Drawing Sheets

WAFER LASER PROCESSING METHOD AND LASER BEAM PROCESSING MACHINE

FIELD OF THE INVENTION

The present invention relates to a wafer laser processing method for forming a deteriorated layer in the inside of a wafer having devices in a plurality of areas sectioned by a plurality of streets formed in a lattice pattern on the front surface along the streets by applying a laser beam along the streets, and to a laser beam processing machine.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas in each of which a device is formed. Further, an optical device wafer comprising a gallium nitride-based compound semiconductor laminated on the front surface of a sapphire substrate is also cut along predetermined streets to be divided into individual optical devices such as light-emitting diodes or laser diodes which are widely used in electric appliances.

As a means of dividing the above semiconductor wafer or optical device wafer along the streets, a method in which a pulse laser beam of a wavelength having permeability for the wafer is applied with its focal point set to the inside of the area to be divided is attempted and disclosed by Japanese Patent No. 3408805. In this dividing method making use of the laser processing technique, the wafer is divided along the streets by applying a pulse laser beam at an infrared range allowing passing through the workpiece with its focal point set to the inside from the rear surface of the wafer to continuously form a deteriorated layer in the inside of the wafer along the streets and exerting external force along the streets whose strength has been reduced by the formation of the deteriorated layers.

A pulse laser beam having a wavelength of 1,064 nm is currently used as the pulse laser beam of a wavelength having permeability for the wafer. In a case that the deteriorated layer is formed in the inside of the wafer by applying the pulse laser beam having a wavelength of 1,064 nm, however, the formed deteriorated layer is thin and a large number of deteriorated layers must be formed in order to form a deteriorated layer thick enough to enable the division of the wafer, thereby causing a problem in reduction of the productivity, though they do not exert an influence on the devices formed on the front surface.

Meanwhile, a pulse laser beam having a wavelength of 1,342 nm whose permeability for a wafer is higher than that of the pulse laser beam having a wavelength of 1,064 nm has been implemented. When a deteriorated layer is formed in the inside of the wafer by using this pulse laser beam having a wavelength of 1,342 nm, a thick deteriorated layer having strong destructive force can be formed.

SUMMARY OF THE INVENTION

It is an object of the present invention to provide a wafer laser processing method capable of forming a deteriorated layer having required thickness in the inside of a wafer without affecting an influence on devices formed on the front surface, and a laser beam processing machine.

To attain the above object, according to the present invention, there is provided a wafer laser processing method for forming deteriorated layers in the inside of a wafer having devices which are formed in a plurality of areas sectioned by a plurality of streets formed in a lattice pattern on the front surface along the streets by applying a laser beam along the streets, comprising:

a first deteriorated layer forming step for forming a first deteriorated layer along the streets near the front surface of the wafer by applying a laser beam having a wavelength of 1,064 nm from the rear surface side of the wafer along the streets with its focal spot set to a position near the front surface of the wafer; and a second deteriorated layer forming step for forming a second deteriorated layer along the streets at a position closer to the rear surface of the wafer than the first deteriorated layer by applying a laser beam having a wavelength of 1,342 nm from the rear surface side of the wafer along the streets with its focal spot set to a position closer to the rear surface than the first deteriorated layer.

Further, according to the present invention, there is also provided a wafer laser processing method for forming deteriorated layers in the inside of a wafer having devices which are formed in a plurality of areas sectioned by a plurality of streets formed in a lattice pattern on the front surface along the streets by applying a laser beam along the streets, comprising:

a first deteriorated layer forming step for forming a first deteriorated layer along the streets near the rear surface of the wafer by applying a laser beam having a wavelength of 1,342 nm from the front surface side of the wafer along the streets with its focal spot set to a position near the rear surface of the wafer; and a second deteriorated layer forming step for forming a second deteriorated layer along the streets at a position closer to the front surface of the wafer than the first deteriorated layer by applying a laser beam having a wavelength of 1,064 nm from the front surface side of the wafer along the streets with its focal spot set to a position closer to the front surface than the first deteriorated layer.

Further, according to the present invention, there is provided a laser beam processing machine comprising a chuck table for holding a wafer, a laser beam application means for applying a laser beam to the wafer held on the chuck table, a processing-feed means for moving the chuck table and the laser beam application means relative to each other in a processing-feed direction, and an indexing-feed means for moving the chuck table and the laser beam application means relative to each other in an indexing-feed direction perpendicular to the processing-feed direction, wherein the laser beam application means comprises a first laser beam application means having a laser beam oscillator for oscillating a laser beam having a wavelength of 1,064 nm and a second laser beam application means having a laser beam oscillator for oscillating a laser beam having a wavelength of 1,342 nm.

Since a deteriorated layer is formed near the front surface in the inside of the wafer with a laser beam having a wavelength of 1,064 nm which has relatively weak destructive force in the present invention, the devices formed on the front surface of the wafer are not damaged. Meanwhile, as a deteriorated layer is formed near the rear surface in the inside of the wafer where the devices formed on the front surface of the wafer are not affected with a laser beam having a wavelength of 1,342 nm which has strong destructive force, the thick deteriorated layer can be formed. Therefore, the deteriorated layers having a required thickness can be formed efficiently.

DETAILED DESCRIPTION OF THE PREFERRED EMBODIMENT

Preferred embodiments of the present invention will be described in detail with reference to the accompanying drawings.

Figure 1:
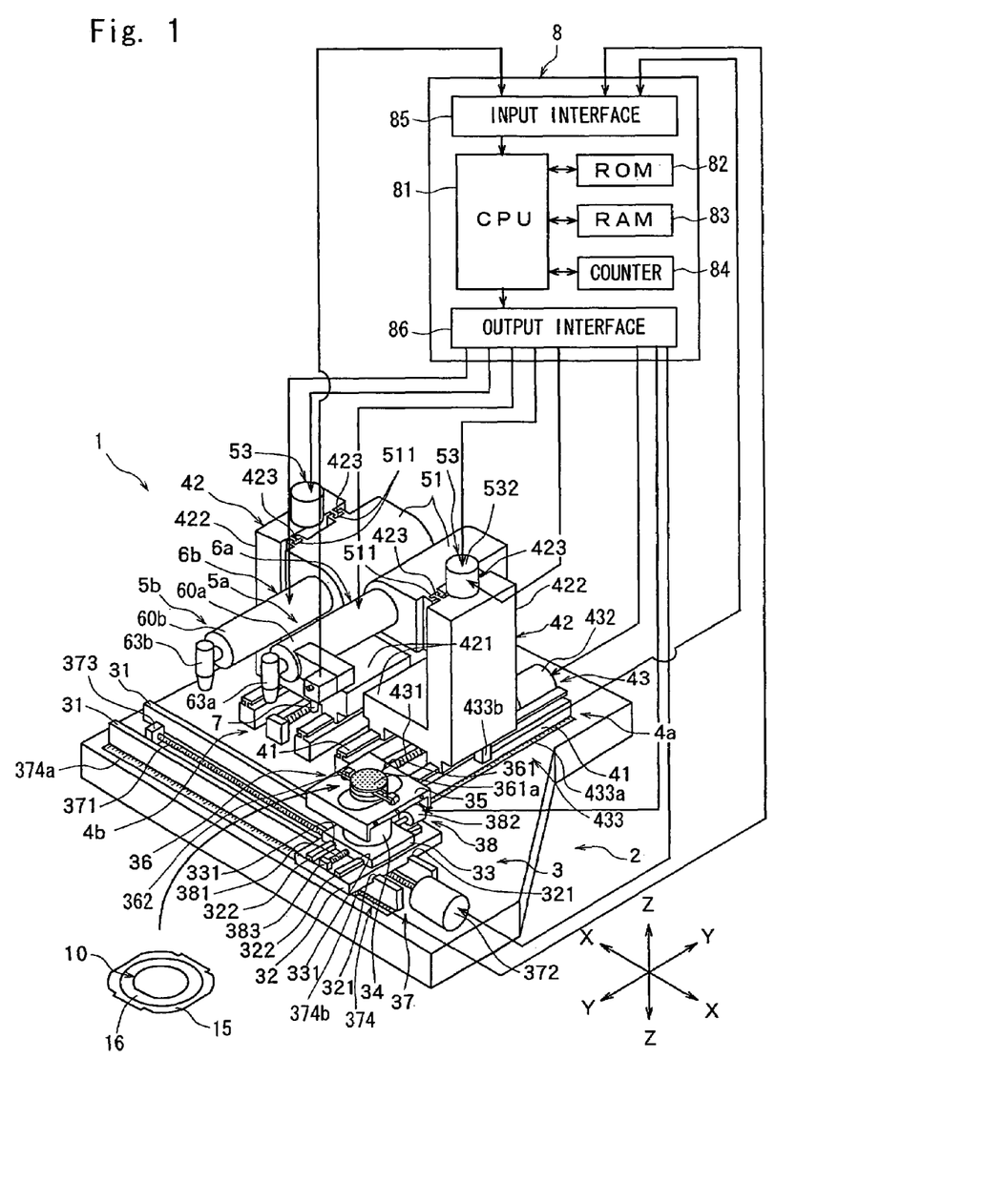
FIG. 1 is a perspective view of a laser beam processing machine constituted according to the present invention.

FIG. 1 is a perspective view of a laser beam processing machine constituted according to the present invention. The laser beam processing machine 1 shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4a mounted on the stationary base 2 in such a manner that it can move in an indexing-feed direction indicated by an arrow Y perpendicular to the processing-feed direction indicated by the arrow X, a first laser beam application unit 5a mounted on the laser beam application unit support mechanism 4a in such a manner that it can move in a direction indicated by an arrow Z, a second laser beam application unit support mechanism 4b, and a second laser beam application unit 5b mounted on the second laser application unit support mechanism 4b in such a manner that it can move in the direction indicated by the arrow Z.

The above chuck table mechanism 3 comprises a pair of guide rails 31 and 31 which is mounted on the stationary base 2 and arranged parallel to each other in the processing-feed direction indicated by the arrow X, a first sliding block 32 mounted on the guide rails 31 and 31 in such a manner that it can move in the direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 comprises an adsorption chuck 361 made of a porous material, and a wafer as a workpiece is held on the workpiece mounting surface 361a of the adsorption chuck 361 by a suction means that is not shown. The chuck table 36 is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 that is arranged between the above pair of guide rails 31 and 31 in parallel to each other and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine 1 in the illustrated embodiment comprises a processing-feed amount detection means 374 for detecting the processing-feed amount of the above chuck table 36. The processing-feed amount detection means 374 comprises a linear scale 374a arranged along the guide rail 31 and a read head 374b that is mounted on the first sliding block 32 and moves along the linear scale 374a together with the first sliding block 32. The read head 374b of this processing-feed amount detection means 374 supplies one pulse signal for every 1 μm to a control means which will be described later, in the illustrated embodiment. The control means described later counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means described later for outputting a drive signal to the pulse motor 372. When a servo motor is used as a drive source for the above processing-feed means 37, pulse signals outputted from a rotary encoder for detecting the revolution of the servo motor are supplied into the control means described later and the control means described later counts the pulse signals input, thereby making it possible to detect the processing-feed amount of the chuck table 36.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment has a first indexing-feed means 38 for moving the second sliding block 33 along the pair of guide rails 322 and 322 on the first sliding block 32 in the indexing-feed direction indicated by the arrow Y. The first indexing-feed means 38 comprises a male screw rod 381 that is arranged between the above pair of guide rails 322 and 322 in parallel to each other and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in the female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above first laser beam application unit support mechanism 4a has a pair of guide rails 41 and 41 which are mounted on the stationary base 2 and arranged parallel to each other in the indexing-feed direction indicated by the arrow Y and a movable support base 42 mounted on the guide rails 41 and 41 in such a manner that it can move in the indexing-feed direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z, that is, the direction perpendicular to the workpiece mounting surface 361a of the above chuck table 36 on one of its flanks. The first laser beam application unit support mechanism 4a in the illustrated embodiment comprises a second indexing-feed means 43 for moving the movable support base 42 along the pair of guide rails 41 and 41 in the indexing-feed direction indicated by the arrow Y. This second indexing-feed means 43 comprises a male screw rod 431 that is arranged between the above pair of guide rails 41 and 41 in parallel to each other and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in the female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam processing machine 1 in the illustrated embodiment has an indexing-feed amount detection means 433 for detecting the indexing-feed amount of the movable support base 42 of the above laser beam application unit support mechanism 4. This indexing-feed amount detection means 433 comprises a linear scale 433a that is arranged along the guide rail 41 and a read head 433b that is mounted on the movable support base 42 and moves along the linear scale 433a. The read head 433b of the indexing-feed amount detection means 433 supplies one pulse signal for every 1 μm to the control means described later in the illustrated embodiment. The control means described later counts the input pulse signals to detect the indexing-feed amount of the laser beam application unit 5. When the pulse motor 432 is used as a drive source for the above second indexing-feed means 43, the indexing-feed amount of the laser beam application unit 5 can be detected by counting the drive pulses of the control means for outputting a drive signal to the pulse motor 432. When a servo motor is used as a drive source for the above second indexing-feed means 43, pulse signals outputted from a rotary encoder for detecting the revolution of the servo motor are supplied into the control means described later and the control means described later counts the pulse signals input, thereby making it possible to detect the indexing-feed amount of the laser beam application unit 5.

The first laser beam application unit 5a in the illustrated embodiment comprises a unit holder 51 and a first laser beam application means 6a attached to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively. The first laser beam application unit 5a in the illustrated embodiment comprises a focal point position adjustment means 53 for moving the unit holder 51 along the pair of guide rails 423 and 423 in the direction indicated by the arrow Z. The focal point position adjustment means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the first laser beam application unit 5a is moved along the guide rails 423 and 423 in the direction indicated by the arrow Z.

Figure 2:
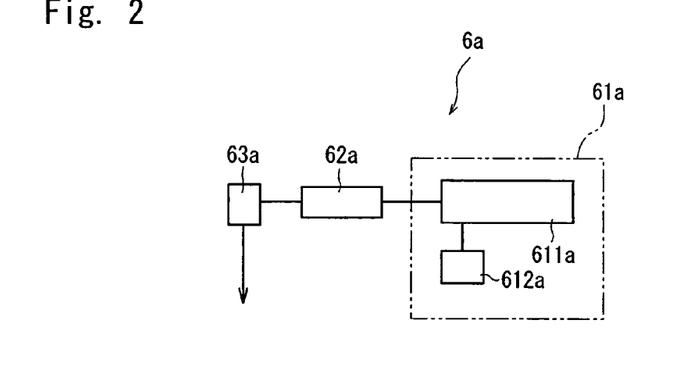
FIG. 2 is a constituent block diagram of a first laser beam application means provided in the laser beam processing machine shown in FIG. 1.

The first laser beam application means 6a comprises a cylindrical casing 60a that is secured to the above unit holder 51 and extends substantially horizontally. The first laser beam application means 6a comprises a pulse laser beam oscillation means 61a and an output adjustment means 62a both of which are installed in the casing 60a and a condenser 63a mounted on the end of the above casing 60a as shown in FIG. 2. The above pulse laser beam oscillation means 61a is constituted by a pulse laser beam oscillator 611a composed of a YAG laser oscillator or YVO4 laser oscillator and a repetition frequency setting means 612a attached to the pulse laser beam oscillator 611a. The pulse laser beam oscillator 611a of this pulse laser beam oscillation means 61a oscillates a pulse laser beam having a wavelength of 1,064 nm. The output adjustment means 62a adjusts the output of a pulse laser beam oscillated from the pulse laser beam oscillation means 61a to a predetermined value.

An image pick-up means 7 is installed to the end portion of the casing 60a constituting the above first laser beam application means 6a. This image pick-up means 7 is constituted by an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means described later.

A description will be subsequently given of the above second laser beam application unit support mechanism 4b and the second laser beam application unit 5b. As for the second laser beam application unit support mechanism 4b and the second laser beam application unit 5b, their constituent members having substantially the same functions as the constituent members of the above first laser beam application unit support mechanism 4a and the first laser beam application unit 5a are given the same reference symbols.

The second laser beam application unit support mechanism 4b is arranged parallel to the above first laser beam application unit support mechanism 4a, and the movable support base 42 of the second laser beam application unit support mechanism 4b is opposed to the movable support base 42 of the above first laser beam application unit support mechanism 4a. Therefore, the first laser beam application unit 5a mounted on the mounting portion 422 constituting the movable support base 42 of the above first laser beam application unit support mechanism 4a and the second laser beam application unit 5b mounted on the mounting portion 422 constituting the movable support base 42 of the second laser beam application unit support mechanism 4b are arranged axisymmetrical at positions close to each other. No image pick-up means is installed to the end portion of a casing 60b constituting the second laser beam application means 6b of the second laser beam application unit 5b.

Figure 3:
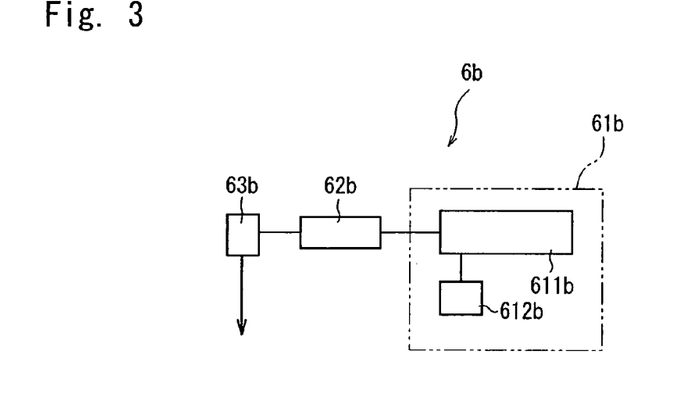
FIG. 3 is a constituent block diagram of a second laser beam application means provided in the laser beam processing machine shown in FIG. 1.

The second laser beam application means 6b comprises the cylindrical casing 60b that is secured to the unit holder 51 and extends substantially horizontally. The second laser beam application means 6b has a pulse laser beam oscillation means 61b and an output adjustment means 62b both of which are installed in the casing 60b and a condenser 63b mounted on the end of the above casing 60b, as shown in FIG. 3. The above pulse laser beam oscillation means 61b is constituted by a pulse laser beam oscillator 611b composed of a YVO4 laser oscillator and a repetition frequency setting means 612b attached to the pulse laser beam oscillator 611b. The pulse laser beam oscillator 611b of this pulse laser beam oscillation means 61b oscillates a pulse laser beam having a wavelength of 1,342 nm. The output adjustment means 62b controls the output of a pulse laser beam oscillated from the pulse laser beam oscillation means 61b to a predetermined value.

The laser beam processing machine 1 in the illustrated embodiment comprises the control means 8. The control means 8 is constituted by a computer which comprises a central processing unit (CPU) 81 for carrying out arithmetic processing based on a control program, a read-only memory (ROM) 82 for storing the control program, etc., a read/write random access memory (RAM) 83 for storing the results of operations, a counter 84, an input interface 85 and an output interface 86. Detection signals from the above processing-feed amount detection means 374, the indexing-feed amount detection means 434 and the image pick-up means 7 are supplied to the input interface 85 of the control means 8. And, from the output interface 86 of the control means 8, control signals are supplied to the above pulse motor 372, the pulse motor 382, the pulse motor 432, the pulse motor 532, the first laser beam application means 6a and the second laser beam application means 6b.

The laser beam processing machine 1 in the illustrated embodiment is constituted as described above, and the wafer processing method for forming deteriorated layers in the inside of the wafer by using this laser beam processing machine 1 will be described hereinbelow.

Figure 4:
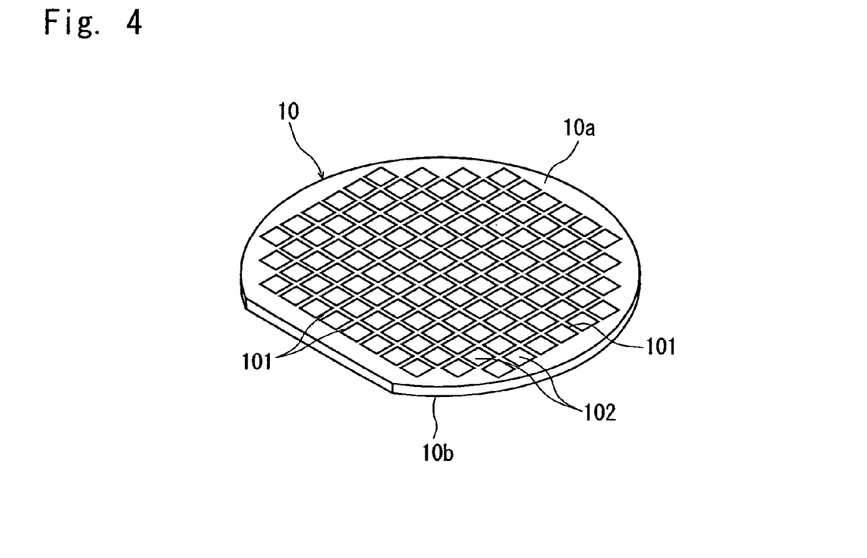
FIG. 4 is a perspective view of a semiconductor wafer as a wafer to be processed by the wafer laser processing method of the present invention.

FIG. 4 is a perspective view of a semiconductor wafer as a wafer to be processed by the wafer processing method of the present invention. The semiconductor wafer 10 shown in FIG. 4 is made of a silicon wafer having a thickness of 100 μm, a plurality of streets 101 are formed in a lattice pattern on the front surface 10a and a device 102 such as IC or LSI is formed in each of a plurality of areas sectioned by the plurality of streets 101.

A first embodiment of the present invention in which deteriorated layers are formed in the inside of the above semiconductor wafer 10 along the streets 101 will be described with reference to FIGS. 5 to 8.

Figure 5:
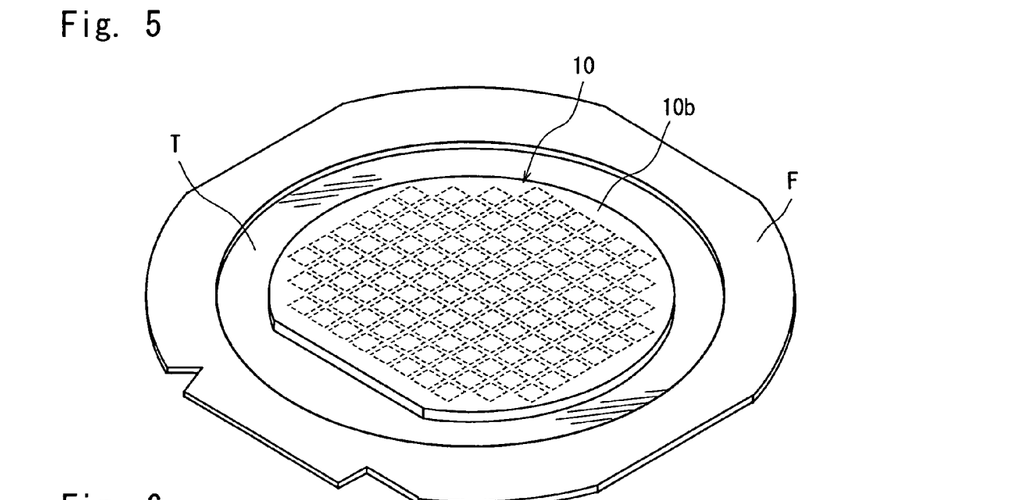
FIG. 5 is a perspective view of the semiconductor wafer shown in FIG. 4 whose front surface is put on the front surface of a protective tape mounted on an annular frame.
Figure 6:
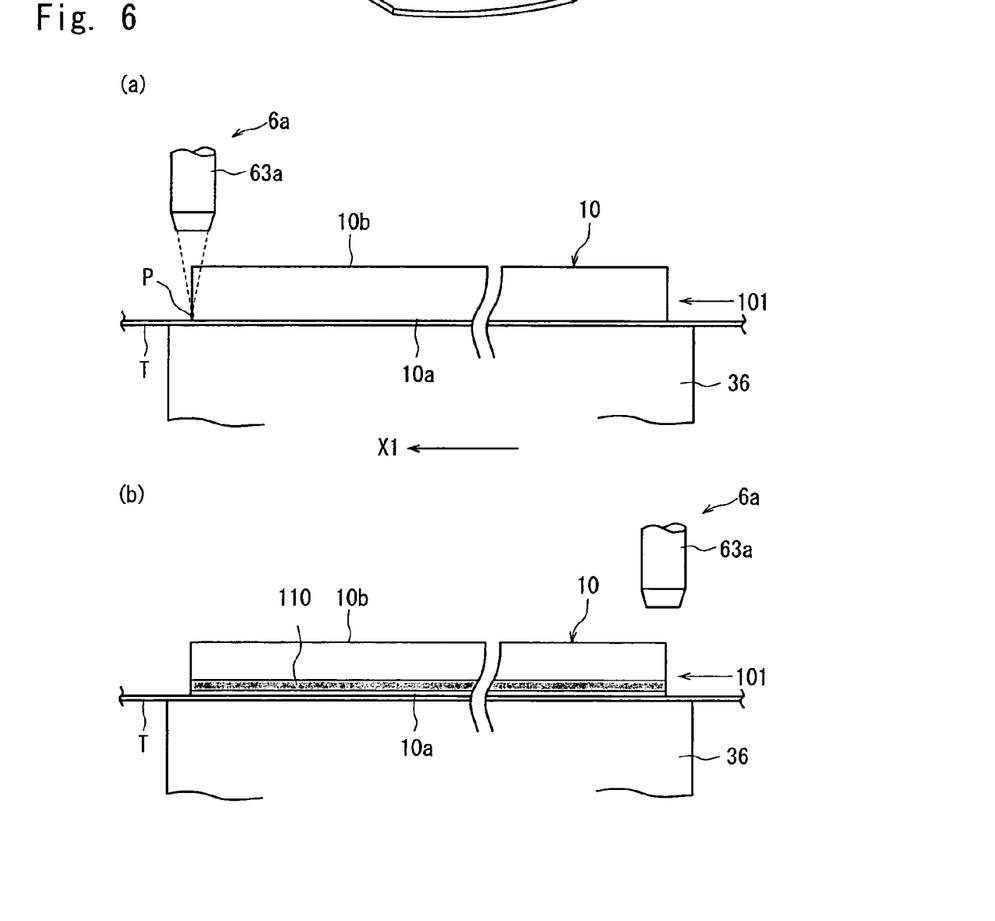
FIGS. 6(a) and 6(b) are explanatory views showing the first deteriorated layer forming step in the first embodiment of the wafer laser processing method of the present invention.
Figure 7:
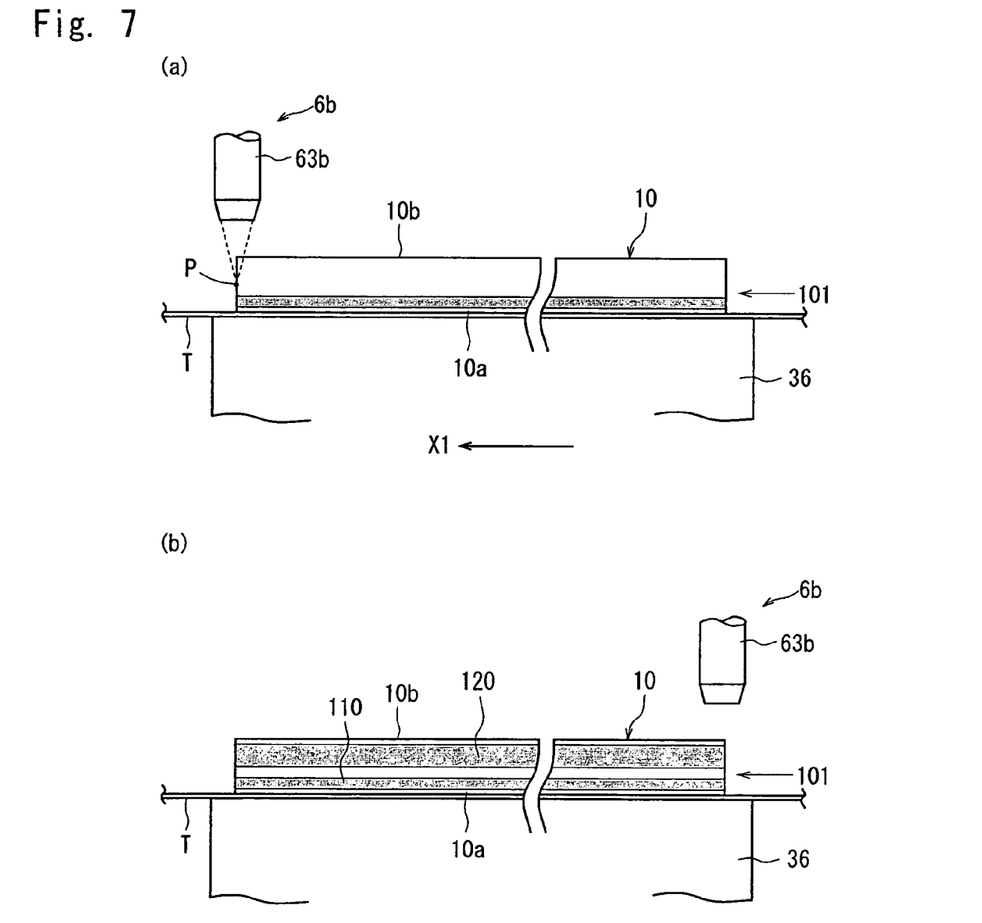
FIGS. 7(a) and 7(b) are explanatory views showing the second deteriorated layer forming step in the first embodiment of the wafer laser processing method of the present invention.

The front surface 10a of the semiconductor wafer 10 constituted as described above is put on a protective tape T which is composed of a synthetic resin sheet such as a polyolefin sheet and the like and mounted on an annular frame F, as shown in FIG. 5. Therefore, the rear surface 10b of the semiconductor wafer 10 faces up. The protective tape T side of the semiconductor wafer 10 supported to the annular frame F through the protective tape T is placed on the chuck table 36 of the laser beam processing machine 1 shown in FIG. 1. The semiconductor wafer 10 is then suction-held on the chuck table 36 through the protective tape T by activating the suction means that is not shown. The annular frame F is fixed by clamps 362.

The chuck table 36 suction-holding the semiconductor wafer 10 as described above is brought to a position right below the image pick-up means 7 by the processing-feed means 37. After the chuck table 36 is positioned right below the image pick-up means 7, alignment work for detecting the area to be processed of the semiconductor wafer 10 is carried out by the image pick-up means 7 and the control means 8. That is, the image pick-up means 7 and the control means 8 carry out image processing such as pattern matching, etc. to align a street 101 formed in a predetermined direction of the semiconductor wafer 10 with the condenser 6a of the first laser beam application means 6a and the condenser 63b of the second laser beam application means 6b for applying a laser beam along the street 101, thereby performing the alignment of a laser beam application position. The alignment of the laser beam application position is also carried out on streets 101 formed on the semiconductor wafer 10 in a direction perpendicular to the above predetermined direction.

After the street 101 formed on the semiconductor wafer 10 held on the chuck table 36 is detected and the alignment of the laser beam application position is carried out by as described above, next comes a first deteriorated layer forming step for forming a first deteriorated layer along the street 101 near the front surface 10a of the semiconductor wafer 10 by applying a pulse laser beam having a wavelength of 1,064 nm from the rear surface 10b of the semiconductor wafer 10 along the street 101 with its focal point set to a position near the front surface 10a of the semiconductor wafer 10. That is, the control means 8 activates the processing-feed means 37 to move the chuck table 36 to a laser beam application area where the condenser 63a of the first laser beam application means 6a is located as shown in FIG. 6(a) so as to bring one end (left end in FIG. 6(a)) of the predetermined street 101 to a position right below the condenser 63a of the first laser beam application means 6a. And, the focal point P of the pulse laser beam applied from the condenser 63a of the first laser beam application means 6a is set at a position to the rear surface 10b (top surface) side by 10 μm from the front surface 10a (undersurface) of the semiconductor wafer 10. Thereafter, the control means 8 activates the pulse laser beam oscillation means 61a of the first laser beam application means 6a to apply a pulse laser beam having a wavelength of 1,064 nm which has permeability for a silicon wafer from the condenser 63a while activating the pulse motor 372 of the processing-feed means 37 to move the chuck table 36 in the direction indicated by the arrow X1 in FIG. 6(a) at a predetermined feed rate. When the application position of the condenser 63a reaches the other end of the street 101 as shown in FIG. 6(b), the application of the pulse laser beam is suspended and the movement of the chuck table 36 is stopped. As a result, a first deteriorated layer 110 having a predetermined thickness is formed near the front surface 10a (undersurface) in the inside of the semiconductor wafer 10 along the street 101, as shown in FIG. 6(b).

The processing conditions in the above first deteriorated layer forming step are set as follows, for example.

Light source: YAG laser
Wavelength: pulse laser beam having a wavelength of 1,064 nm
Repetition frequency: 400 kHz
Average output: 1 W
Focal spot diameter: 1 μm
Processing-feed rate: 600 mm/sec When the first deteriorated layer forming step is carried out under the above processing conditions, the first deteriorated layer 110 having a thickness of about 20 μm is formed. Although the focal point P of the pulse laser beam is set to a position near the front surface 10a of the semiconductor wafer 10 in the first deteriorated layer forming step, the destructive force of the pulse laser beam having a wavelength of 1,064 nm is relatively weak and hence, does not damage the devices 102 formed on the front surface 10a of the semiconductor wafer 10.

After the above first deteriorated layer forming step is carried out along the predetermined street 101 as described above, the control means 8 activates the pulse motor 382 of the first indexing-feed means 38 to move the chuck table 36 a distance corresponding to the interval between adjacent streets 101 in the direction indicated by the arrow Y in FIG. 1 so as to carry out the above first deteriorated layer forming step. After the above first deteriorated layer forming step is carried out on all the streets 101 formed in the predetermined direction of the semiconductor wafer 10 as described above, the chuck table 36 is turned at 90° to turn the semiconductor wafer 10 held on the chuck table 36 at 90° and then, the above first deteriorated layer forming step is carried out along streets 101 formed in a direction perpendicular to the above predetermined direction. Thereby, the first deteriorated layer 110 can be formed along all the streets 101 in the inside of the semiconductor 10.

After the first deteriorated layer 110 is formed near the front surface 10a of the semiconductor wafer 10 along the streets 101 by carrying out the above first deteriorated layer forming step along all the streets 101 formed on the semiconductor wafer 10 as described above, next comes a second deteriorated layer forming step for forming a second deteriorated layer along the streets 101 at a position closer to the rear surface 10b of the semiconductor wafer 10 than the first deteriorated layer 110 by applying a pulse laser beam having a wavelength of 1,342 nm from the rear surface 10b side of the semiconductor wafer 10 along the streets 101 with its focal point set to a position closer to the rear surface 10b of the semiconductor wafer 10 than the first deteriorated layer 110.

That is, the control means 8 activates the processing-feed means 37 to move the chuck table 36 to a laser beam application area where the condenser 63b of the second laser beam application means 6b is located as shown in FIG. 7(a) so as to bring one end (left end in FIG. 7(a)) of the predetermined street 101 to a position right below the condenser 63b of the second laser beam application means 6b. The focal point P of the pulse laser beam applied from the condenser 63b of the second laser beam application means 6b is set to a position 20 μm from the first deteriorated layer 110 toward the rear surface 10b (top surface) side. Thereafter, the control means 8 activates the pulse laser beam oscillation means 61b of the second laser beam application means 6b to apply a pulse laser beam having a wavelength of 1,342 nm which has permeability for a silicon wafer from the condenser 63b while activating the pulse motor 372 of the processing-feed means 37 to move the chuck table 36 in the direction indicated by the arrow X1 in FIG. 7(a) at a predetermined feed rate. When the application position of the condenser 63b reaches the other end of the street 101 as shown in FIG. 7(b), the application of the pulse laser beam is suspended and the movement of the chuck table 36 is stopped. As a result, a second deteriorated layer 120 having a predetermined thickness is formed in the inside of the semiconductor wafer 10 along the street 101 at a position 20 μm from the first deteriorated layer 110 toward the rear surface 10b (top surface) side, as shown in FIG. 7(b).

The processing conditions in the above second deteriorated layer-forming step are set as follows, for example.

Figure 8:
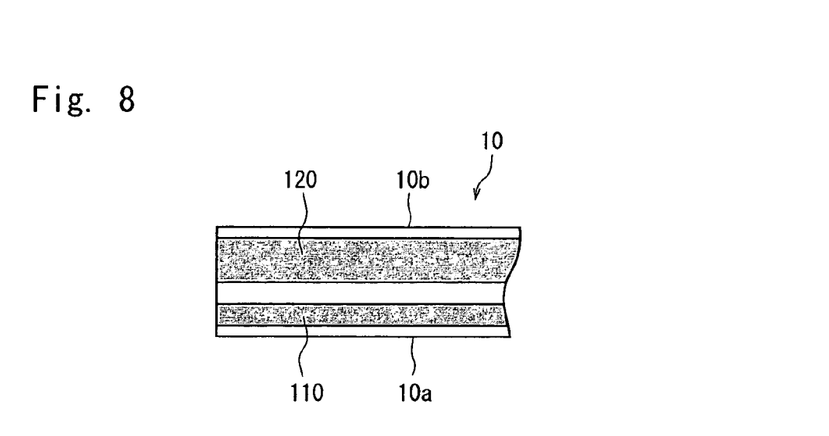
FIG. 8 is an enlarged sectional view of the principal portion of the semiconductor wafer which has undergone the first deteriorated layer forming step and the second deteriorated layer forming step in the first embodiment of the wafer laser processing method of the present invention.

Light source: YVO4 laser
Wavelength: pulse laser beam having a wavelength of 1,342 nm
Repetition frequency: 80 kHz
Average output: 1 W
Focal spot diameter: 1.3 μm
Processing-feed rate: 600 mm/sec When the second deteriorated layer forming step is carried out under the above processing conditions, the second deteriorated layer 120 having a thickness of about 40 μm is formed. Since the second deteriorated layer forming step is carried out by using a pulse laser beam having a wavelength of 1,342 nm which has strong destructive force, even though the pulse laser beam has the same output as the pulse laser beam having a wavelength of 1,064 nm used in the first deteriorated layer forming step, the second deteriorated layer 120 having a thickness twice as large as that of the first deteriorated layer 110 can be formed. Therefore, when the above first deteriorated layer forming step and the second deteriorated layer forming step are carried out on the semiconductor wafer 10 having a thickness of 100 μm, as shown in FIG. 8, the first deteriorated layer 110 having a thickness of 20 μm is formed at a position 10 μm from the front surface 10a (undersurface) toward the rear surface 10b (top surface) side and the second deteriorated layer 120 having a thickness of 40 μm is formed at a position 20 μm from the first deteriorated layer 110 toward the rear surface 10b (top surface) side in the inside of the semiconductor wafer 10. Thus, when the above first deteriorated layer forming step and the second deteriorated layer forming step are carried out on the semiconductor wafer 10 having a thickness of 100 μm one time each, deteriorated layers having a total thickness which is 60% of the thickness of the semiconductor wafer 10 can be formed. If deteriorated layers having a total thickness which is 60% of the thickness of the semiconductor wafer having a thickness of 100 μm is formed by using the pulse laser beam having a wavelength of 1,064 nm, the above first deteriorated layer forming step must be carried out three times. Although the destructive force of the pulse laser beam having a wavelength of 1,342 nm used in the second deteriorated layer forming step is strong, as the second deteriorated layer 120 formed by the second deteriorated layer forming step is formed at a position closer to the rear surface 10b side than the first deteriorated layer 110, the devices 102 formed on the front surface 10a of the semiconductor wafer 10 are not damaged.

The above second deteriorated layer forming step is also carried out along all the streets 101 formed on the semiconductor wafer 10, like the first deteriorated layer forming step. As a result, the first deteriorated layer 110 is formed near the front surface 10a and the second deteriorated layer 120 is formed near the rear surface 10b in the inside of the semiconductor wafer 10 along the streets 101.

In the above embodiment, one first deteriorated layer and one second deteriorated layer are formed in the first deteriorated layer forming step and the second deteriorated layer forming step, respectively. Two or more deteriorated layers may be formed as required according to the thickness of the wafer.

A second embodiment of the wafer laser processing method of the present invention will be described with reference to FIGS. 9 to 12.

In the embodiment shown in FIGS. 9 to 12, deteriorated layers are formed in the inside of the semiconductor wafer 10 efficiently by applying a pulse laser beam from the front surface 10a side of the semiconductor wafer 10 with the above laser beam processing machine 1.

Figure 9:
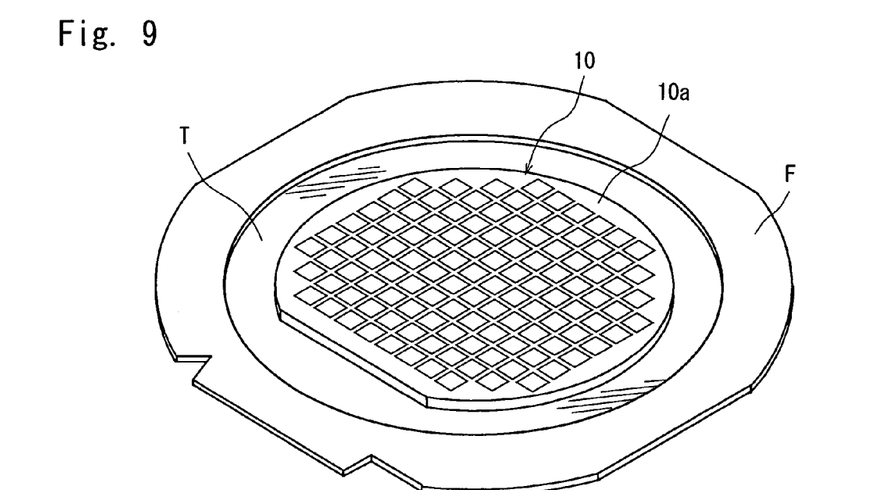
FIG. 9 is a perspective view of the semiconductor wafer shown in FIG. 4 whose rear surface is put on the front surface of the protective tape mounted on the annular frame.
Figure 10:
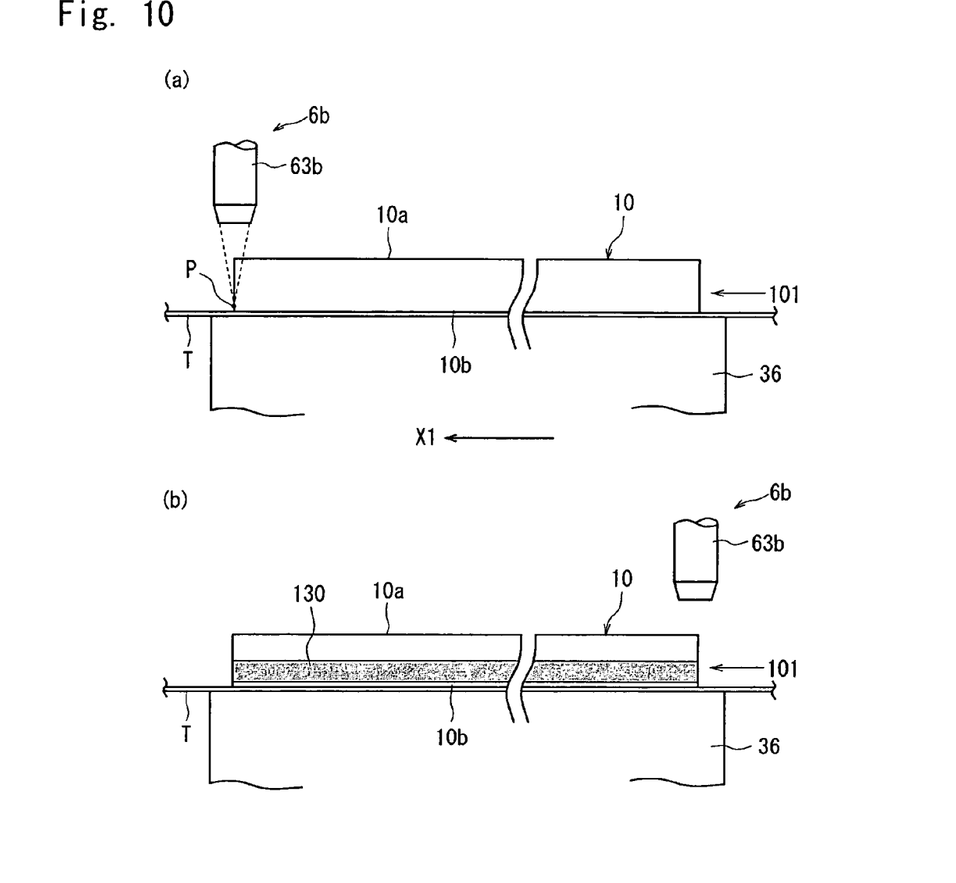
FIGS. 10(a) and 10(b) are explanatory views showing the first deteriorated layer forming step in the second embodiment of the wafer laser processing method of the present invention.
Figure 11:
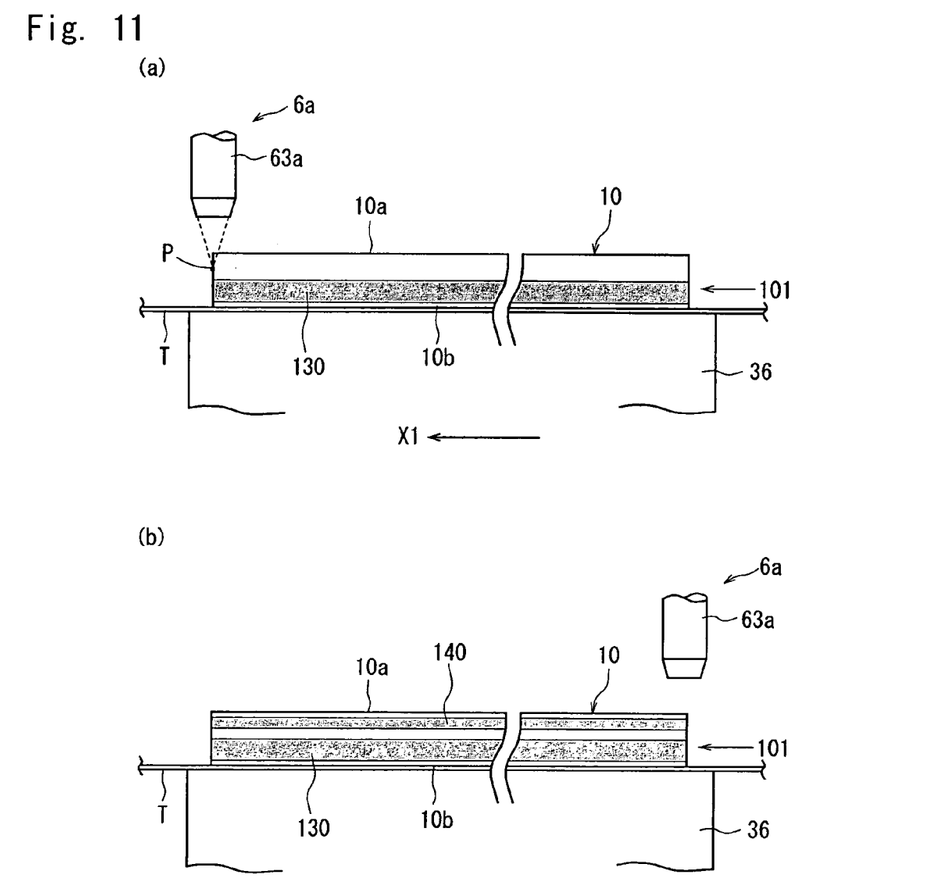
FIGS. 11(a) and 11(b) are explanatory views showing the second deteriorated layer forming step in the second embodiment of the wafer laser processing method of the present invention.

To carry out the second embodiment, the rear surface 10b of the semiconductor wafer 10 shown in FIG. 4 is put on the protective tape T mounted on the annular frame F as shown in FIG. 9. Therefore, the front surface 10a of the semiconductor wafer 10 faces up. The protective tape T side of the semiconductor wafer 10 supported to the annular frame F through the protective tape T is placed on the chuck table 36 of the laser beam processing machine 1 shown in FIG. 1. The semiconductor wafer 10 is then suction-held on the chuck table 36 through the protective tape T by activating the suction means that is not shown. The annular frame F is fixed by the clamps 362.

After the semiconductor wafer 10 is suction-held on the chuck table 36 as described above, the chuck table 36 is brought to a position right below the image pick-up means 7 to carry out alignment work for detecting the area to be processed of the semiconductor wafer 10 by means of the image pick-up means 7 and the control means 8, like the first embodiment.

After a street 101 formed on the semiconductor wafer 10 held on the chuck table 36 is detected and the alignment of the laser beam application position is carried out, next comes the first deteriorated layer forming step for forming a first deteriorated layer along the street 101 near the rear surface 10b of the semiconductor wafer 10 by applying a pulse laser beam having a wavelength of 1,342 nm from the front surface 10a of the semiconductor wafer 10 along the street 101 with its focal point set to a position near the rear surface 10b of the semiconductor wafer 10. That is, the control means 8 activates the processing-feed means 37 to move the chuck table 36 to the laser beam application area where the condenser 63b of the second laser beam application means 6b is located as shown in FIG. 10(a) and then, bring one end (left end in FIG. 10(a)) of the predetermined street 101 to a position right below the condenser 63b of the second laser beam application means 6b. The focal point P of the pulse laser beam applied from the condenser 63b of the second laser beam application means 6b is set to a position 10 µm from the rear surface 10b (undersurface) of the semiconductor wafer 10 toward the front surface 10a (top surface) side. Thereafter, the control means 8 activates the pulse laser beam oscillation means 61b of the second laser beam application means 6b to apply the pulse laser beam having a wavelength of 1,342 nm from the condenser 63b while activating the pulse motor 372 of the processing-feed means 37 to move the chuck table 36 in the direction indicated by the arrow X1 in FIG. 10(a) at a predetermined feed rate. When the application position of the condenser 63b reaches the other end of the street 101 as shown in FIG. 10(b), the application of the pulse laser beam is suspended and the movement of the chuck table 36 is stopped. The processing conditions of this first deteriorated layer forming step may be the same as the processing conditions of the second deteriorated layer forming step in the above first embodiment. As a result, a first deteriorated layer 130 having a thickness of 40 µm is formed near the rear surface 10b (undersurface) in the inside of the semiconductor wafer 10 along the street 101 as shown in FIG. 10(b). Although the pulse laser beam having a wavelength of 1,342 nm used in the first deteriorated layer forming step has strong destructive force as described above, as the first deteriorated layer 130 formed by the first deteriorated layer forming step is formed near the rear surface 10b of the semiconductor wafer 10, the devices 102 formed on the front surface 10a of the semiconductor wafer 10 are not damaged.

The above first deteriorated layer forming step is carried out along all the streets 101 formed on the semiconductor wafer 10. As a result, the first deteriorated layer 130 having a thickness of 40 µm is formed near the rear surface 10b (undersurface) in the inside of the semiconductor wafer 10 along all the streets 101.

After the first deteriorated layer 130 is formed near the rear surface 10b of the semiconductor wafer 10 along the streets 101 by carrying out the above first deteriorated layer forming step along all the streets 101 formed on the semiconductor wafer 10 as described above, next comes the second deteriorated layer forming step for forming a second deteriorated layer along the streets 101 at a position closer to the front surface 10a of the semiconductor wafer 10 than the first deteriorated layer 130 by applying a pulse laser beam having a wavelength of 1,064 nm from the front surface 10a side of the semiconductor wafer 10 along the streets 101 with its focal point set to a position closer to the front surface 10a side of the semiconductor wafer 10 than the first deteriorated layer 130. That is, the control means 8 activates the processing-feed means 37 to move the chuck table 36 to the laser beam application area where the condenser 63a of the first laser beam application means 6a is located as shown in FIG. 11(a) and then, bring one end (left end in FIG. 11(a)) of the predetermined street 101 to a position right below the condenser 63a of the first laser beam application means 6a. The focal point P of the pulse laser beam applied from the condenser 63a of the first laser beam application means 6a is set to a position 20 µm from the first deteriorated layer 130 toward the front surface 10a (top surface) side. Thereafter, the control means 8 activates the pulse laser beam oscillation means 61a of the first laser beam application means 6a to apply a pulse laser beam having a wavelength of 1,064 nm from the condenser 63a while activating the pulse motor 372 of the processing-feed means 37 to move the chuck table 36 in the direction indicated by the arrow X1 in FIG. 11(a) at a predetermined feed rate. When the application position of the condenser 63a reaches the other end of the street 101 as shown in FIG. 11(b), the application of the pulse laser beam is suspended and the movement of the chuck table 36 is stopped. The processing conditions of this second deteriorated layer forming step may be the same as the processing conditions of the first deteriorated layer forming step in the above first embodiment. As a result, a second deteriorated layer 140 having a thickness of 20 μm is formed along the street 101 at a position 20 μm from the first deteriorated layer 110 toward the front surface 10a (top surface) side in the inside of the semiconductor wafer 10 as shown in FIG. 11(b). Although the second deteriorated layer 140 is formed near the front surface 10a of the semiconductor wafer 10 in the second deteriorated layer forming step, as the pulse laser beam having a wavelength of 1,064 nm has relatively weak destructive force, the devices 102 formed on the front surface 10a of the semiconductor wafer 10 are not damaged.

Figure 12:
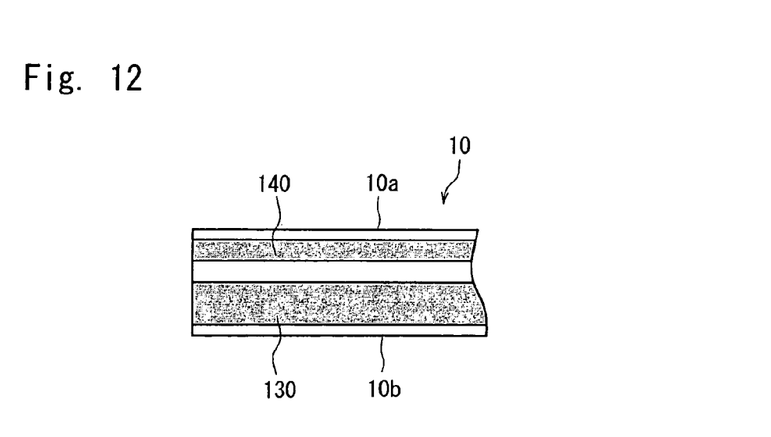
FIG. 12 is an enlarged sectional view of the principal portion of the semiconductor wafer which has undergone the first deteriorated layer forming step and the second deteriorated layer forming step in the second embodiment of the wafer laser processing method of the present invention.

When the above first deteriorated layer forming step and the second deteriorated layer forming step are carried out on the semiconductor wafer 10 having a thickness of 100 μm in the above second embodiment, too, of the wafer laser processing method of the present invention, the first deteriorated layer 130 having a thickness of 40 μm is formed at a position 10 μm from the rear surface 10b (undersurface) toward the front surface 10a (top surface) side and the second deteriorated layer 140 having a thickness of 20 μm is formed at a position 20 μm from the first deteriorated layer 130 toward the front surface 10a (top surface) side in the inside of the semiconductor wafer 10, as shown in FIG. 12. Thus, when the above first deteriorated layer forming step and the second deteriorated layer forming step are carried out on the semiconductor wafer 10 having a thickness of 100 μm one time each, deteriorated layers having a total thickness which is 60% of the thickness of the semiconductor wafer 10 can be formed.

In the above embodiment, one first deteriorated layer and one second deteriorated layer are formed in the first deteriorated layer forming step and the second deteriorated layer forming step, respectively. Two or more deteriorated layers may be formed as required according to the thickness of the wafer.

A description will be subsequently given of another embodiment of the laser beam application means provided in the above laser beam processing machine 1 with reference to FIG. 13. In the laser beam application means 6 shown in FIG. 13, the same constituent members as the first laser beam application means 6a shown in FIG. 2 and the second laser beam application means 6b shown in FIG. 3 are given the same reference symbols and their descriptions are omitted.

Figure 13:
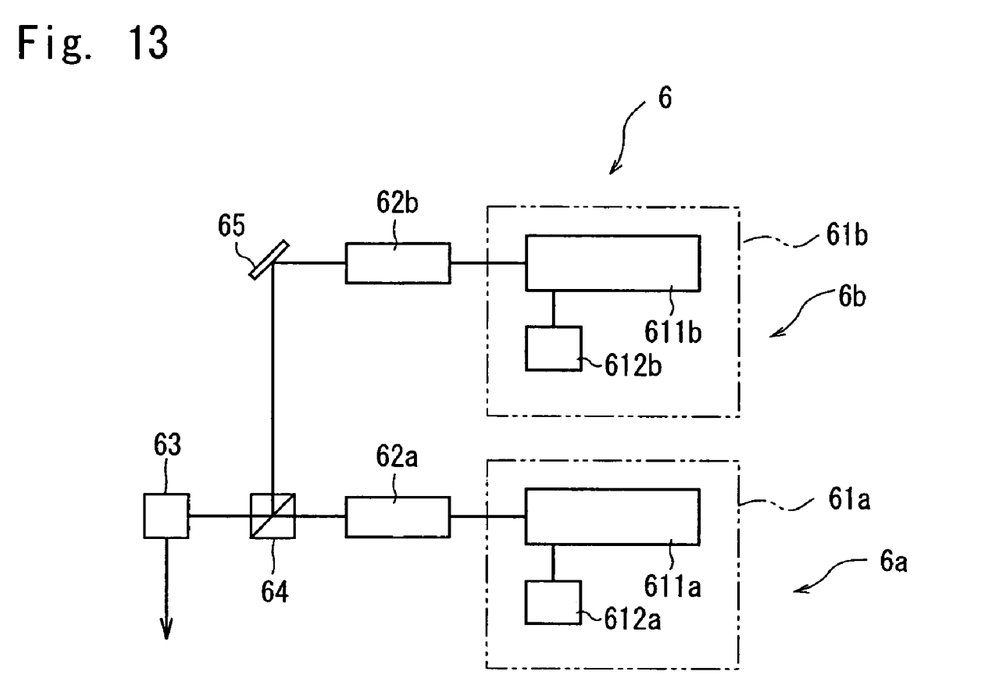
FIG. 13 is a constituent block diagram of another embodiment of laser beam application means provided in the laser beam processing machine shown in FIG. 1.

In the laser beam application means 6 shown in FIG. 13, a shared condenser 63 serves as both the condenser of the first laser beam application means 6a and the condenser of the second laser beam application means 6b. That is, in the laser beam application means 6 shown in FIG. 13, after the output of a pulse laser beam having a wavelength of 1,064 nm oscillated from the pulse laser beam oscillation means 61a of the first laser beam application means 6a is adjusted by the output adjustment means 62a, the pulse laser beam is guided to the shared condenser 63 through a half mirror 64. Meanwhile, a pulse laser beam having a wavelength of 1,342 nm oscillated from the pulse laser beam oscillation means 61b of the second laser beam application means 6b is guided to the shared condenser 63 through a direction changing mirror 65 and the above half mirror 64. Since the laser beam application means 6 shown in FIG. 13 is thus so constituted as to apply the pulse laser beam having a wavelength of 1,064 nm and the pulse laser beam having a wavelength of 1,342 nm from the shared condenser 63, the first laser beam application means 6a and the second laser beam application means 6b can be constituted as a single unit.

What is claimed is:

1. A wafer laser processing method for forming deteriorated layers in the inside of a wafer having devices which are formed in a plurality of areas sectioned by a plurality of streets formed in a lattice pattern on the front surface along the streets by applying a laser beam along the streets, comprising:
   a first deteriorated layer forming step for forming along the streets near the front surface of the wafer by applying a laser beam having a wavelength of 1,064 nm from the rear surface side of the wafer along the streets with its focal spot set to a position near the front surface of the wafer; and
   a second deteriorated layer forming step for forming a second deteriorated layer along the streets at a position closer to the rear surface of the wafer than the first deteriorated layer by applying a laser beam having a wavelength of 1,342 nm from the rear surface side of the wafer along the streets with its focal spot set to a position closer to the rear surface than the first deteriorated layer.

2. A wafer laser processing method for forming deteriorated layers in the inside of a wafer having devices which are formed in a plurality of areas sectioned by a plurality of streets formed in a lattice pattern on the front surface along the streets by applying a laser beam along the streets, comprising:
   a first deteriorated layer forming step for forming a first deteriorated layer along the streets near the rear surface of the wafer by applying a laser beam having a wavelength of 1,342 nm from the front surface side of the wafer along the streets with its focal spot set to a position near the rear surface of the wafer; and
   a second deteriorated layer forming step for forming a second deteriorated layer along the streets at a position closer to the front surface of the wafer than the first deteriorated layer by applying a laser beam having a wavelength of 1,064 nm from the front surface side of the wafer along the streets with its focal spot set to a position closer to the front surface than the first deteriorated layer.

* * * * *